United States Patent
Mun et al.

(10) Patent No.: US 9,275,736 B2
(45) Date of Patent: Mar. 1, 2016

(54) SEMICONDUCTOR DEVICE AND OPERATING METHOD THEREOF

(71) Applicant: Sk hynix Inc., Icheon-si Gyeonggi-do (KR)

(72) Inventors: Kyung Sik Mun, Icheon-si (KR); Hee Youl Lee, Icheon-si (KR); Se Jun Kim, Suwon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/331,444

(22) Filed: Jul. 15, 2014

(65) Prior Publication Data

US 2015/0235702 A1   Aug. 20, 2015

(30) Foreign Application Priority Data

Feb. 19, 2014   (KR) .................. 10-2014-0019235

(51) Int. Cl.
*G11C 15/00* (2006.01)
*G11C 15/04* (2006.01)
*G11C 5/02* (2006.01)
(Continued)

(52) U.S. Cl.
CPC *G11C 15/04* (2013.01); *G11C 5/02* (2013.01); *G11C 15/046* (2013.01); *G11C 16/0466* (2013.01); *G11C 16/0483* (2013.01);
(Continued)

(58) Field of Classification Search
CPC .... G11C 16/10; G11C 16/26; G11C 16/0483; G11C 16/14; G11C 16/08; G11C 16/0408; G11C 16/3445; G11C 13/0069; G11C 15/04; G11C 16/16; G11C 16/3459; G11C 29/025; G11C 11/5642; G11C 13/0004

USPC .............. 365/185.18, 185.11, 185.29, 185.12, 365/185.17, 185.22, 148, 185.01, 185.03, 365/185.2, 200, 49.17

See application file for complete search history.

(56) References Cited

U.S. PATENT DOCUMENTS

2013/0094294 A1*   4/2013   Kwak et al. ............... 365/185.03

FOREIGN PATENT DOCUMENTS

KR   1020110008556 A   1/2011
KR   10-1076880 B1   10/2011

*Primary Examiner* — Thong Q Le

(74) *Attorney, Agent, or Firm* — William Park & Associates Ltd.

(57) ABSTRACT

The semiconductor device includes a CAM block including a plurality of vertical strings having a perpendicular configuration with respect to a semiconductor substrate, wherein each of the plurality of vertical strings is electrically coupled to a plurality of word lines and each of the plurality of word lines is electrically coupled to a plurality of CAM cells, a peripheral circuit configured to program CAM cells selected from the plurality of CAM cells, and a control circuit configured to issue at least one command to the peripheral circuit to simultaneously apply a program voltage to an $n^{th}$ word line, an $n-1^{th}$ word line and an $n+1^{th}$ word line to simultaneously program CAM cells electrically coupled to the $n-1^{th}$ word line, the $n^{th}$ word line and the $n+1^{th}$ word line, wherein the $n-1^{th}$ word line and an $n+1^{th}$ word line are adjacent to the $n^{th}$ word line and the selected CAM cells are electrically coupled to the $n^{th}$ word line.

17 Claims, 3 Drawing Sheets

(51) Int. Cl.
*G11C 16/04* (2006.01)
*G11C 16/10* (2006.01)
*H01L 27/115* (2006.01)

(52) U.S. Cl.
CPC ............ *G11C16/10* (2013.01); *H01L 27/1157* (2013.01); *H01L 27/11582* (2013.01)

SEMICONDUCTOR DEVICE AND OPERATING METHOD THEREOF

CROSS-REFERENCE TO RELATED APPLICATION

The present application claims priority to Korean patent application number 10-2014-0019235 filed on Feb. 19, 2014, in the Korean Intellectual Property Office, the entire disclosure of which is incorporated by reference herein.

BACKGROUND

1. Technical Field

Embodiments relate to a semiconductor device and an operating method thereof, and more particularly, to a programming method of a 3-dimensional semiconductor memory device.

2. Related Art

A semiconductor device typically uses a memory cell array to store data. The memory cell array includes a plurality of memory blocks. One or more of the plurality of memory blocks are used as normal memory blocks. Normal data is stored in the normal memory blocks. One or more of the memory blocks are used as content addressable memory (CAM) blocks. Data, such as for example, operation setting values of the semiconductor device are stored in the CAM blocks. Examples of operation setting values include bad block repair information, and bias information.

The operating characteristics of a semiconductor device may vary depending on the conditions associated with the manufacturing process of the semiconductor device. In many cases, the operation setting values stored in the CAM block are derived by performing one or more test operations prior to the packaging the semiconductor device.

The data stored in the CAM block prior to the packaging of the semiconductor device may become corrupted due to relatively high temperatures that may be generated by a number of different manufacturing processes. For example, relatively high temperatures are often applied to the semiconductor device during a wire bonding processing.

A 3-dimensional semiconductor device includes a plurality of vertical strings, where the vertical strings have a generally perpendicular configuration with respect to a semiconductor substrate. The memory cells in the vertical strings do not have the floating structure that is typically used in a 2-dimensional semiconductor device. A 3-dimensional semiconductor devices uses a charge trap structure.

SUMMARY

An embodiment of a semiconductor device includes a CAM block including a plurality of vertical strings having a perpendicular configuration with respect to a semiconductor substrate, wherein each of the plurality of vertical strings is electrically coupled to a plurality of word lines and each of the plurality of word lines is electrically coupled to a plurality of CAM cells, a peripheral circuit configured to program CAM cells selected from the plurality of CAM cells, and a control circuit configured to issue at least one command to the peripheral circuit to simultaneously apply a program voltage to an $n^{th}$ word line, an $n-1^{th}$ word line and an $n+1^{th}$ word line to simultaneously program the CAM cells electrically coupled to the $n-1^{th}$ word line, the $n^{th}$ word line and the $n+1^{th}$ word line, wherein the $n-1^{th}$ word line and the $n+1^{th}$ are adjacent to the $n^{th}$ word line and the selected CAM cells are electrically coupled to the $n^{th}$ word line.

An embodiment of an operating method of a semiconductor device includes programming a plurality of CAM cells connected by a charge trap layer, simultaneously programming a CAM cell selected from the plurality of CAM cells, and CAM cells adjacent to the selected CAM cell.

An embodiment of an operating method of a semiconductor device includes a CAM block including a plurality of vertical strings having a generally perpendicular configuration with respect to a semiconductor substrate, wherein each of the plurality of vertical strings is electrically coupled to a plurality of word lines and each of the plurality of word lines is electrically coupled to a plurality of CAM cells, simultaneously program the CAM cells electrically coupled to an $n^{th}$ word line, an $n-1^{th}$ word line and an $n+1^{th}$ word line wherein the $n-1^{th}$ word line and an $n+1^{th}$ word line are adjacent to the $n^{th}$ word line and selected CAM cells are electrically coupled to the $n^{th}$ word line.

DETAILED DESCRIPTION

Figure 1:
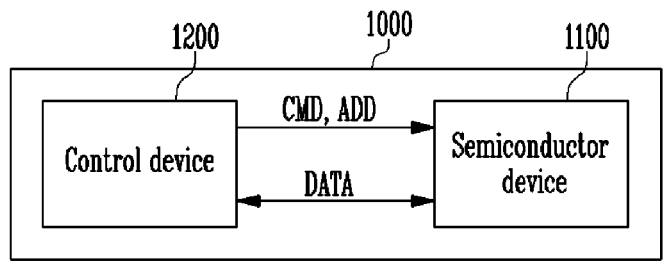
FIG. 1 is a block diagram representation of an embodiment of a semiconductor system.

Referring to FIG. 1 a block diagram representation of an embodiment of a semiconductor system is shown.

The semiconductor system 1000 includes a semiconductor device 1100 configured to store data, and a control device 1200 configured to control the semiconductor device 1100. For example, the control device 1200 outputs a command signal CMD and an address ADD to the semiconductor device 1100 in response to a command received from an external device external to the semiconductor device 1100. The semiconductor device 1100 performs a program, read or erase operation in response to the command signal CMD and the address ADD. The semiconductor device 1100 and the control device 1200 exchange data DATA with each other. The semiconductor device 1100 includes a plurality of memory blocks (not shown). One or more of the plurality of memory blocks are used as a content addressable memory (CAM) block. Operation setting values of the semiconductor device 1100 are stored in the content addressable memory (CAM) block. Examples of operation setting values include, but are not limited to, bad block repair information, and bias information.

Figure 2:
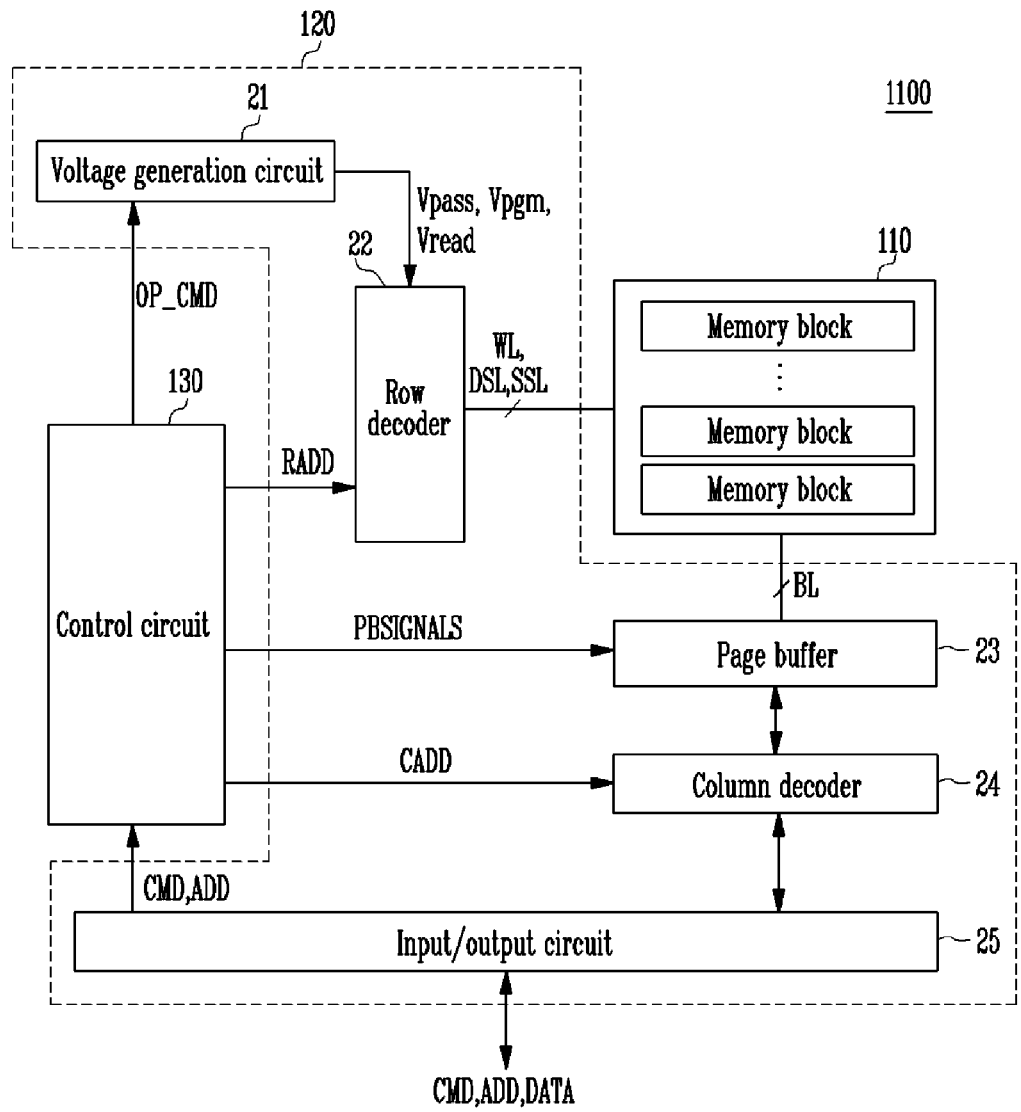
FIG. 2 is a block diagram representation of the semiconductor device in FIG. 1.

Referring to FIG. 2 a block diagram representation of an embodiment of the semiconductor device in FIG. 1 is shown.

The semiconductor device 1100 includes a memory cell array 110 configured to store data, a peripheral circuit 120 configured to perform program, read and erase operations of the memory cell array 110, and a control circuit 130 configured to control the peripheral circuit 120.

The memory cell array 110 includes a plurality of memory blocks. Each of the memory blocks includes vertical strings. The vertical strings are arranged in a generally perpendicular configuration with respect to a semiconductor substrate. The vertical strings include memory cells having a charge trap structure. One or more of the memory blocks are used as normal memory blocks. Normal data is stored the normal memory blocks. One or more of the memory blocks are used as CAM blocks. Operation setting values are stored in the CAM blocks. The structure of the CAM blocks will be described below with reference to FIG. 3.

The peripheral circuit 120 includes a voltage generation circuit 21, a row decoder 22, a page buffer 23, a column decoder 24 and an input/output circuit 25.

The voltage generation circuit 21 is configured to generate operation voltages having different levels in response to an operation command signal OP_CMD. The operation command signal OP_CMD may include a program command signal, a read command signal, and an erase command signal. For example, the voltage generation circuit 21 generates an erase voltage Vera, a program voltage Vpgm, a read voltage Vread and a pass voltage Vpass, and voltages having different levels.

The row decoder 22 is configured to select one of the plurality of memory blocks in the memory cell array 110 in response to a row address RADD. The row decoder 22 transmits the operation voltages to word lines WL, drain select lines DSL, source select lines SSL, bit lines BL and source lines SL that are electrically coupled to to the selected memory block.

The page buffer 23 is electrically coupled to the memory blocks via the bit lines BL. The page buffer 23 is configured to transmit data to and receive data from the selected memory block during the program, read and erase operations. The page buffer 23 temporarily stores the received data.

The column decoder 24 is configured to send data to and receive data from the page buffer 23 in response to a column address CADD.

The input/output circuit 25 is configured to transmit a command signal CMD and an address ADD received from an external device external to the control circuit 130. The input/output circuit 25 is configured to transmit data DATA received from the external device to the column decoder 24, and transmit data DATA received from the column decoder 24 to the external device or to the control circuit 130.

The control circuit 130 is configured to control the peripheral circuit 120 in response to the command signal CMD and the address ADD. For example, the control circuit 130 is configured to issue one or more commands to the peripheral circuit 120 to perform the program, read and erase operations in response to the command signal CMD and the address ADD. As mentioned above, there are two types of memory blocks, CAM blocks and normal memory blocks. When an operation of programming data for an operation setting value is performed on the CAM block, the control circuit 130 issues one or more commands to the peripheral circuit 120 to substantially simultaneously apply the program voltage to a selected word line and to the word lines adjacent to an upper portion and a lower portion of the selected word line, and to substantially simultaneously program CAM cells electrically coupled to the selected word line and to the adjacent word lines. When an operation of programming the normal memory blocks is performed, the control circuit 130 issues one or more commands to the peripheral circuit 120 to perform the program operation by applying the program voltage to the selected word line. Program voltages are not applied to word lines that are adjacent the selected word line during a programming operation of a normal memory block.

Figure 3:
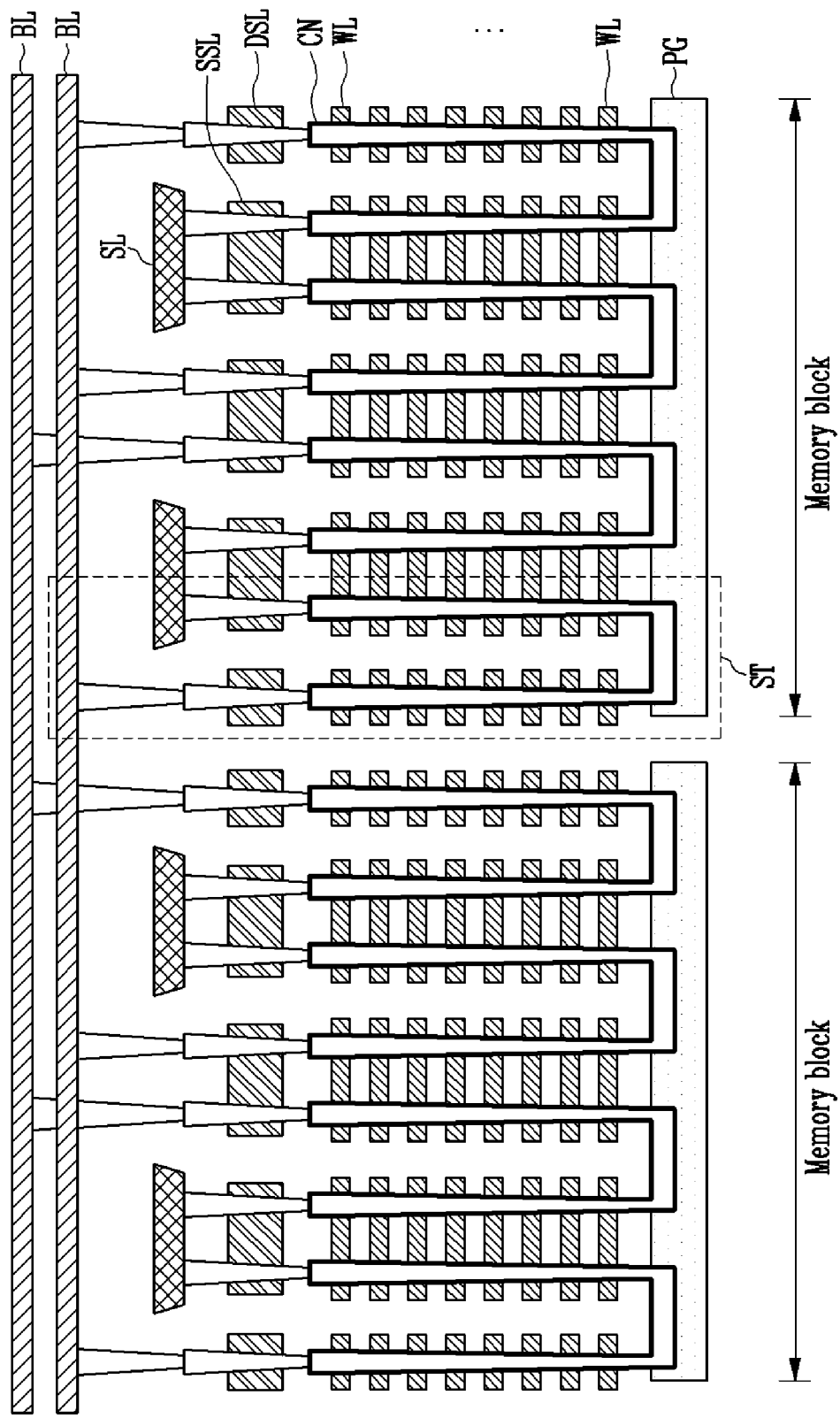
FIG. 3 is a cross-sectional view of a memory block of a 3-dimensional semiconductor device.

Referring to FIG. 3 a cross-sectional view of a memory block of a 3-dimensional semiconductor device is shown.

The plurality of memory blocks have substantially the same structure. The normal memory block and the CAM block both have substantially the same structure. The memory block includes a plurality of strings ST formed in a generally perpendicular configuration with respect to a semiconductor substrate. The strings ST disposed adjacent to one another are formed in a generally symmetrical structure.

Each of the plurality of strings includes a pipe gate PG formed on a substrate. Vertical channel layers CN extend in a generally perpendicular direction with respect to the pipe gate PG. A plurality of word lines WL are stacked along the length of the vertical channel layers CN and are spaced apart from one another, a drain select line DSL and a source select line SSL. The pipe gate PG connects the vertical channel layers CN to one another. The memory cells are formed between the vertical channel layers CN and the word lines WL. A drain select transistor is formed between a plug extending to an upper portion of one end of the vertical channel layers CN and the drain select line DSL. A source select transistor is formed between a plug connected to an upper portion of the other end of the vertical channel layers CN and the source select line SSL. The source line SL is connected to the plug. The source select transistor is formed in the plug connected to the source line SL. The bit line BL is connected to the plug. The drain select transistor is formed in the plug connected to the bit line BL.

A program operation of the CAM block with reference to the above-described semiconductor device is described below.

Figure 4:
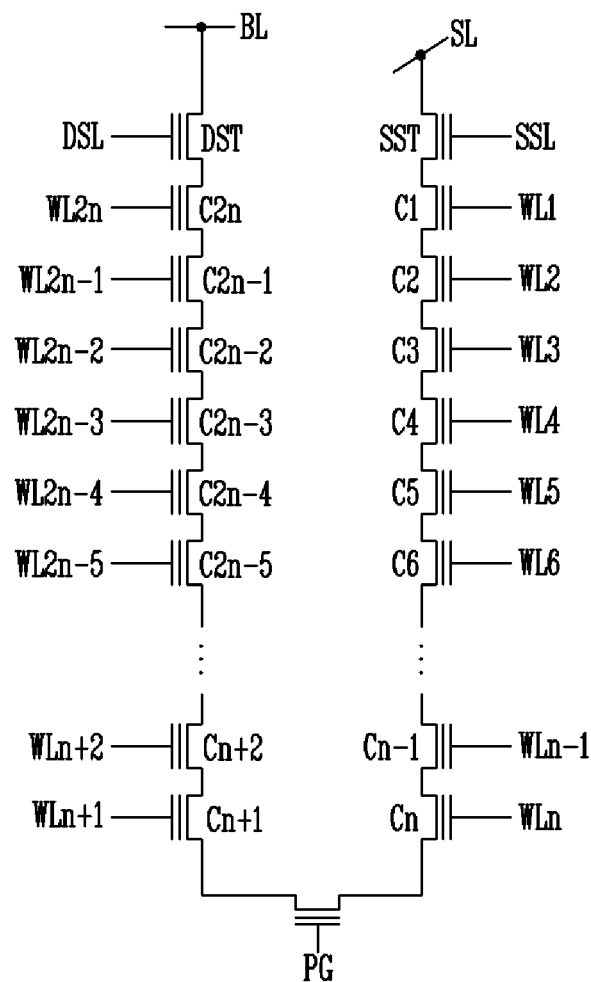
FIG. 4 is a circuit diagram representation of an embodiment of a content addressable memory (CAM) block.

Referring to FIG. 4 a circuit diagram representation of an embodiment of a content addressable memory (CAM) block is shown.

A string set includes two strings that are electrically coupled via a pipe gate PG. A program operation is performed on CAM cells in a selected string set 40. The string set 40 includes a source select transistor SST and a plurality of CAM cells C1-Cn. The source select transistor SST and the plurality of CAM cells C1-Cn are electrically coupled in series between a source line SL and the pipe gate PG. A plurality of CAM cells Cn+1-C2n and a drain select transistor DST are electrically coupled in series between the pipe gate PG and a bit line BL. A gate of the source select transistor SST is electrically coupled to a source select line SSL, the gates of the CAM cells C1-C2n are electrically coupled to word lines WL1-WL2n, and a gate of the drain select transistor DST is electrically coupled to a drain select line DSL.

The program operation is performed by substantially simultaneously applying a program voltage Vpgm to a selected word line and to the word lines that are vertically adjacent to the selected word line. For example, when a fifth CAM cell C5 is selected for programming, the fifth word line WL5 that is electrically coupled to the gate of the fifth CAM cell C5 is the selected word line. The fourth and sixth word lines WL4, WL6 are vertically adjacent to the fifth word line WL5.

When the program operation is initiated, a program voltage Vpgm of approximately the same level is substantially simultaneously applied to the selected word line WL5 and to the adjacent word lines WL4, WL6. The fifth CAM cell C5 is electrically coupled to the the selected word line WL5. The fourth CAM cell C4 is electrically coupled to an adjacent word line WL4 and the sixth CAM cell C6 is electrically coupled to an adjacent word line WL6. The fourth, fifth and sixth CAM cells are substantially simultaneously programmed upon the substantial simultaneous application of approximately the same the program voltage Vpgm to the selected word line WL5 and to the adjacent word lines WL4, WL6. When the program voltage Vpgm is applied to the selected word line WL5 and to the adjacent word lines WL4, WL6, a pass voltage is applied to the other word lines WL1-

WL3, WL7-WL2n. Following the application of the program voltage Vpgm to the selected word line WL5 and to the adjacent word lines WL4, WL6 for a period of time, a verify voltage is applied to the selected word line WL5, and a verify operation is performed to determine whether a threshold voltage of the fifth CAM cell C5 is greater than a target level. The program operation of the CAM block generally includes the substantially simultaneous application of the program voltage Vpgm to the selected word line WL5 and to the adjacent word lines WL4, WL6, followed by the application of the verify voltage to the selected word line WL5. Following the performance of the program operation, when a read operation of the CAM block is performed, a read voltage is applied to the selected word line WL5, and the fifth CAM cell C5 is read. The fourth and sixth CAM cells C4, C6 adjacent to an upper portion and a lower portion of the fifth CAM cell C5, respectively, are simultaneously programmed at substantially the same time as the fifth CAM cell C5 to relatively improve the retention characteristic of the fifth CAM cell C5. When the verify operation or the read operation is performed, the pass voltage is applied to the other word lines including the fourth word line WL4 and the sixth word line WL6.

Figure 5:
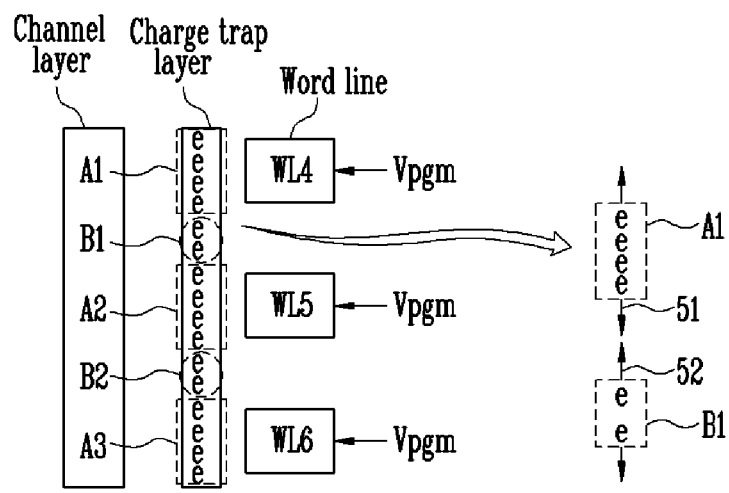
FIG. 5 is a block diagram representation of an embodiment of a section of content addressable memory (CAM) block.

If the fifth CAM cell C5, the selected CAM cell, and the fourth and sixth CAM cells C4, C6, the adjacent the selected CAM cell C5 are substantially simultaneously programmed, the retention characteristic of the fifth CAM cell C5 may be improved. Referring to FIG. 5 is a block diagram representation of a portion of a CAM block is shown.

A memory cell of a 3-dimensional semiconductor device is formed in a charge trap structure. The memory cells are configured to cover a channel layer, and a word line is configured to cover the memory cells. The memory cells are configured of a charge trap layer connected with one another. The charge trap layer is formed to cover the channel layer, and to be spaced apart from the channel layer. The word lines are formed to cover the charge trap layer, and are spaced apart from the charge trap layer. When a program voltage Vpgm is applied to a selected word line, a charge is trapped in the charge trap layer adjacent to the selected word line. When a program voltage Vpgm having a positive voltage is applied to the selected word line, electrons (e) are trapped in the charge trap layer region adjacent to the selected word line.

When the fifth word line WL5 is the selected word line, and the program voltage Vpgm is substantially simultaneously applied to the fifth word line WL5 and to the fourth and sixth word lines WL4, WL6, where the fourth and sixth word lines WL4, WL6 are vertically adjacent to the fifth word line WL5, electrons (e) are trapped in charge trap layer regions A1, A2, A3. The charge trap layer regions A1, A2, A3 are adjacent to the fourth, fifth, and sixth word lines WL4, WL5, WL6, respectively. Since the program voltage Vpgm is substantially simultaneously applied to the fourth, fifth, and sixth word lines WL4, WL5, WL6, where the fourth and sixth word lines WL4, WL6 are adjacent to the fifth word line WL5, a coupling effect occurs. As a result, electrons (e) are also trapped in a charge trap layer region B1 between the fourth word line WL4 and the fifth word line WL5 and in a charge trap layer region B2 between the fifth word line WL5 and the sixth word line WL6. The densities of the electrons (e) trapped in the charge trap layer regions A1, A2, A3 may be relatively greater than densities of the electrons (e) trapped in the charge trap layer regions B1, B2, B3 regions.

The electrons (e) are trapped in the charge trap layer region A2 adjacent to the selected word line WL5. The electrons (e) are also trapped in the charge trap layers of the upper region B1 and the lower region B2 of the charge trap layer region A2. The electrons (e) trapped in the charge trap layer region A2 and the charge trap layer region B1 repel each other 51, 52. The electrons (e) trapped in the charge trap layer region A2 and the charge trap layer region B2 also repel each other. As a result, the electrons (e) trapped the charge trap layer region A2, adjacent to the selected word line WL5 are emitted. The emission of the electrons (e) trapped in the charge trap layer region A2, adjacent to the selected fifth word line WL5, may improve the retention characteristic of the CAM cells.

Since the program voltage is substantially simultaneously applied to the selected word line WL5 and to the word lines adjacent WL4, WL6 to the upper portion and the lower portion of the selected word line WL5, the selected CAM cells and the CAM cells adjacent to the upper portion and the lower portion of the selected CAM cells are programmed. As a result, the electrons (e) trapped in the charge trap layers of the selected CAM cells are emitted to the upper portion and the lower portion thereof.

A change in threshold voltages of the CAM cells that may be caused by external factors, such as for example a temperature, may be reduced if the retention characteristic of the CAM cells is improved. The reliability of operation setting values stored in the CAM cells may be improved and the reliability of the semiconductor device may be improved.

If the retention characteristic of the CAM block included in a 3-dimensional semiconductor device is enhanced, the reliability of the semiconductor device may be be improved.

While certain embodiments have been described above, it will be understood by those skilled in the art that the embodiments are described by way of example only. Accordingly, the semiconductor devices and operating methods of semiconductor devices described herein should not be limited based on the described embodiments. Rather, the semiconductor devices and operating methods of semiconductor devices described herein should only be limited in light of the claims that follow when taken in conjunction with the above description and accompanying drawings.

What is claimed is:

1. A semiconductor device, comprising:
    a CAM block including a plurality of vertical strings having a perpendicular configuration with respect to a semiconductor substrate, wherein each of the plurality of vertical strings is electrically coupled to a plurality of word lines and each of the plurality of word lines is electrically coupled to a plurality of CAM cells;
    a peripheral circuit configured to program CAM cells selected from the plurality of CAM cells; and
    a control circuit configured to control the peripheral circuit to simultaneously apply a program voltage to an $n^{th}$ word line, an $n-1^{th}$ word line and an $n+1^{th}$ word line to simultaneously program the CAM cells electrically coupled to the $n-1^{th}$ word line, the $n^{th}$ word line and the $n+1^{th}$ word line, wherein the $n-1^{th}$ word line and the $n+1^{th}$ are adjacent to the $n^{th}$ word line and the selected CAM cells are electrically coupled to the $n^{th}$ word line.

2. The semiconductor device of claim 1, wherein each of the vertical strings comprises:
    a channel layer;
    CAM cells configured to cover the channel layer; and
    a plurality of word lines configured to cover the CAM cells.

3. The semiconductor device of claim 2, wherein the CAM cells include a charge trap layer.

4. The semiconductor device of claim 2, wherein the CAM cells covering the channel layer and are spaced apart from the channel layer, and the word lines covering the CAM cells and are spaced apart from the CAM cells.

5. The semiconductor device of claim 1, wherein when one of a verify operation and a read operation is performed following the programming of the CAM cells electrically coupled to the n−1$^{th}$ word line, the n$^{th}$ word line and the n+1$^{th}$ word line, the control circuit issues at least one command to the peripheral circuit to apply one of a verify voltage to verify the CAM cells electrically coupled to the n$^{th}$ word line and a read voltage to the n$^{th}$ word line to read the CAM cells electrically coupled to the n$^{th}$ word line.

6. The semiconductor device of claim 5, wherein when one of the verify operation and the read operation is performed, the control circuit issues at least one command to the peripheral circuit to apply a pass voltage to the n−1$^{th}$ word line and to the n+1$^{th}$ word line.

7. The semiconductor device of claim 1, wherein the peripheral circuit comprises:
   a voltage generation circuit configured to generate operation voltages having various levels in response to an operation command signal;
   a row decoder configured to select a CAM block in response to a row address, and transmit the operation voltages to word lines, drain select lines, source select lines, bit lines and source lines electrically coupled to the selected CAM block;
   a page buffer electrically coupled to the CAM block via the bit lines, and configured to transmit data to and receive data from the CAM block during one or more of a program operation, a read operation and an erase operation, and configured to temporarily store the received data;
   a column decoder configured to transmit data to and receive from the page buffer in response to a column address; and
   an input/output circuit configured to transmit a command signal and an address received from an external device to the control circuit, to transmit data received from the external device to the column decoder, and to transmit data received from the column decoder to one of the external outside and the control circuit.

8. An operating method of a semiconductor device, comprising:
   programming a plurality of CAM cells connected by a charge trap layer,
   simultaneously programming a CAM cell selected from the plurality of CAM cells, and CAM cells adjacent to the selected CAM cells.

9. The operating method of claim 8, wherein simultaneously programming the selected CAM cells and the adjacent CAM cells comprises simultaneously applying a program voltages having the same level to the word lines electrically coupled to the selected CAM cells and to the word lines electrically coupled to the adjacent CAM cells.

10. The operating method of claim 8, further comprising:
    following the simultaneous programming of the selected CAM cells and the adjacent CAM cells,
    performing a verify operation to determine whether a threshold voltage of the selected CAM cell is greater than a target level.

11. The operating method of claim 10, wherein performing the verify operation comprises applying a verify voltage to the word line electrically coupled to the selected CAM cells, and applying a pass voltage to the other word lines, wherein the other word lines include the word lines electrically coupled to the adjacent CAM cells.

12. An operating method of a semiconductor device, comprising:
    programming a CAM block including a plurality of vertical strings having a perpendicular configuration with respect to a semiconductor substrate, wherein each of the plurality of vertical strings is electrically coupled to a plurality of word lines and each of the plurality of word lines is electrically coupled to a plurality of CAM cells,
    simultaneously applying a program voltage to an n$^{th}$ word line, n−1$^{th}$ word line and n+1$^{th}$ word line to simultaneously program the CAM cells electrically coupled to the n−1$^{th}$ word line, the n$^{th}$ word line and the n+1$^{th}$ word line, wherein the n−1$^{th}$ word line and the n+1$^{th}$ word line are adjacent to the n$^{th}$ word line and selected CAM cells are electrically coupled to the n$^{th}$ word line.

13. The operating method of claim 12, wherein simultaneously applying a program voltage to an n$^{th}$ word line, n−1$^{th}$ word line and n+1$^{th}$ word line comprises applying program voltages having the same level to the n−1$^{th}$ word line, the n$^{th}$ word line and the n+1$^{th}$ word line.

14. The operating method of claim 12, further comprising applying a pass voltage to the other word lines while applying the program voltage to the n$^{th}$ word line, the n−1$^{th}$ word line and the n+1$^{th}$ word line.

15. The operating method of claim 12, further comprising:
    after increasing threshold voltages of the CAM cells electrically coupled to the n−1$^{th}$ word line, the n$^{th}$ word line and the n+1$^{th}$ word line by applying the program voltage to the n−1$^{th}$ to n+1$^{th}$ word lines,
    performing a verify operation to determine whether the threshold voltage of the CAM cells electrically coupled to the n$^{th}$ word line is relatively greater than a target level.

16. The operating method of claim 15, wherein performing the verify operation comprises applying a verify voltage to the n$^{th}$ word line and applying the pass voltage to the other word lines.

17. The operating method of claim 12, further comprising performing a read operation of the CAM block after the program operation of the CAM cells has been completed, by applying a read voltage to the n$^{th}$ word line, and applying the pass voltage to the other word lines.

* * * * *